United States Patent
Kim et al.

(10) Patent No.: US 10,825,497 B2
(45) Date of Patent: Nov. 3, 2020

(54) SEMICONDUCTOR DEVICE INCLUDING SPIN-ORBIT TORQUE LINE AND METHOD OF OPERATING THE SAME

(71) Applicant: SAMSUNG ELECTRONICS CO., LTD., Suwon-si (KR)

(72) Inventors: Jae Hoon Kim, Hwaseong-si (KR); Hee Ju Shin, Hwaseong-si (KR); Ung Hwan Pi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/369,869

(22) Filed: Mar. 29, 2019

(65) Prior Publication Data

US 2020/0082858 A1   Mar. 12, 2020

(30) Foreign Application Priority Data

Sep. 12, 2018   (KR) ........................ 10-2018-0108943

(51) Int. Cl.
| | |
|---|---|
| G11C 11/00 | (2006.01) |
| G11C 11/16 | (2006.01) |
| H01L 43/12 | (2006.01) |
| H01L 27/22 | (2006.01) |
| H01L 43/10 | (2006.01) |
| H01L 43/08 | (2006.01) |

(52) U.S. Cl.
CPC ........ *G11C 11/161* (2013.01); *G11C 11/1655* (2013.01); *G11C 11/1657* (2013.01); *G11C 11/1673* (2013.01); *G11C 11/1675* (2013.01); *H01L 27/228* (2013.01); *H01L 43/08* (2013.01); *H01L 43/10* (2013.01); *H01L 43/12* (2013.01)

(58) Field of Classification Search
CPC ............. G11C 11/161; G11C 11/1655; G11C 11/1657; G11C 11/1673
USPC ......................................................... 365/158
See application file for complete search history.

(56) References Cited

U.S. PATENT DOCUMENTS

| | | | |
|---|---|---|---|
| 7,732,881 | B2 | 6/2010 | Wang |
| 8,400,066 | B1 | 3/2013 | Pileggi et al. |
| 8,474,127 | B2 | 7/2013 | Gill et al. |
| 9,300,295 | B1 | 3/2016 | Zhang et al. |
| 9,330,748 | B2* | 5/2016 | Roizin ................ G11C 11/1659 |
| 9,460,397 | B2 | 10/2016 | Apalkov et al. |
| 9,508,925 | B2 | 11/2016 | Pi et al. |
| 2012/0170357 | A1* | 7/2012 | Apalkov ............. G11C 11/5607 365/158 |
| 2015/0213867 | A1 | 7/2015 | Wu et al. |
| 2018/0033954 | A1 | 2/2018 | Aradhya et al. |
| 2018/0040807 | A1* | 2/2018 | Saito ..................... H01L 27/228 |
| 2018/0123026 | A1 | 5/2018 | Sasaki et al. |

(Continued)

FOREIGN PATENT DOCUMENTS

| | | |
|---|---|---|
| JP | 2012-99720 A | 5/2012 |
| KR | 10-215-0040238 A | 4/2015 |
| KR | 10-2016-0031832 A | 3/2016 |

*Primary Examiner* — Vu A Le
(74) *Attorney, Agent, or Firm* — Sughrue Mion, PLLC (57) ABSTRACT

A semiconductor device includes a storage layer including at least one first magnetic layer and a reference layer facing the storage layer and including at least one second magnetic layer. The device also includes a tunnel barrier layer between the storage layer and the reference layer. The device further includes at least one spin-orbit torque line adjacent the storage layer.

20 Claims, 9 Drawing Sheets

(56) References Cited

U.S. PATENT DOCUMENTS

2018/0123028 A1    5/2018  Shiokawa et al.
2018/0159026 A1*   6/2018  Shiokawa ............. H01L 27/222

* cited by examiner

SEMICONDUCTOR DEVICE INCLUDING SPIN-ORBIT TORQUE LINE AND METHOD OF OPERATING THE SAME

CROSS-REFERENCE TO RELATED APPLICATION

This U.S. non-provisional patent application claims priority under 35 U.S.C. § 119 to and the benefit of Korean Patent Application No. 10-2018-0108943, filed on Sep. 12, 2018, in the Korean Intellectual Property Office (KIPO), the disclosure of which is incorporated herein by reference in its entirety.

BACKGROUND

1. Field

Devices and methods consistent with example embodiments relate to a semiconductor device having a spin-orbit torque (SOT) line, a method of operating the semiconductor device, and a method of forming the semiconductor device.

2. Description of Related Art

Research has been conducted on semiconductor memory devices that are advantageous for high integration density and high-speed operations. Due to these needs, a magnetoresistive random access memory (MRAM) using a change in resistance relative to a shift in polarization of a magnetic material has been proposed. A technique of switching polarity of the magnetic material is confronted with various difficulties.

SUMMARY

Example embodiments of the inventive concept are directed to semiconductor devices, methods of operating semiconductor devices, and methods of fabricating semiconductor devices, which may be advantageous for an increase in integration density and improving electrical characteristics.

According to some example embodiments, a semiconductor device includes a storage layer including at least one first magnetic layer and a reference layer facing the storage layer and including at least one second magnetic layer. A tunnel barrier layer is disposed between the storage layer and the reference layer. The device further includes at least one spin-orbit torque line adjacent the storage layer.

According to further example embodiments, a semiconductor device includes a switching element on a substrate, a first electrode on the substrate and electrically connected to the switching element, a buffer layer on the first electrode, and a magnetic tunnel junction on the buffer layer. The magnetic tunnel junction includes a storage layer, a reference layer facing the storage layer, and a tunnel barrier layer between the storage layer and the reference layer. The device further includes a capping layer on the magnetic tunnel junction, a second electrode on the capping layer, and at least one spin-orbit torque line adjacent a side of the storage layer.

According to still further example embodiments, a semiconductor device includes a first electrode on a substrate and a magnetic tunnel junction on the first electrode. The magnetic tunnel junction includes a storage layer, a reference layer facing the storage layer, and a tunnel barrier layer between the storage layer and the reference layer. The device further includes a second electrode on the magnetic tunnel junction and at least one spin-orbit torque line adjacent a side of the storage layer.

DETAILED DESCRIPTION OF EXEMPLARY EMBODIMENTS

Figure 1:
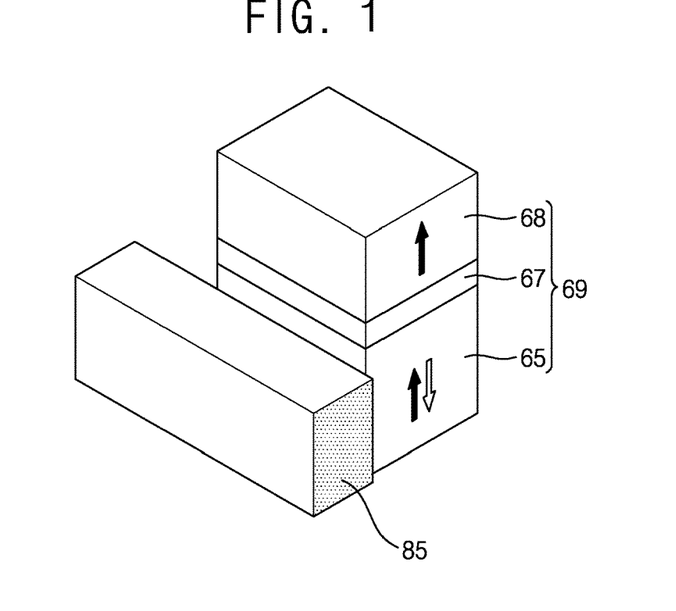
FIG. 1 is a perspective view illustrating a semiconductor device according to some embodiments of the inventive concept.

FIG. 1 is a perspective view illustrating a semiconductor device according to some embodiments according to the inventive concept. Semiconductor devices according to some embodiments of the inventive concept may include a non-volatile memory device such as a magnetoresistive random access memory (MRAM) or cross-point (X-point) memory. In some embodiments, the semiconductor device may include an embedded MRAM (eMRAM). In some embodiments, the semiconductor device may include a perpendicular magnetic tunnel junction (pMTJ)-MRAM.

Referring to FIG. 1, semiconductor devices according to some embodiments of the inventive concept may include a magnetic tunnel junction (MTJ) 69 and a spin-orbit torque (SOT) line 85. The MTJ 69 may include a storage layer 65, a tunnel barrier layer 67, and a reference layer 68. The storage layer 65 may include a free layer. The storage layer 65 may include at least one first magnetic layer including cobalt iron boron (CoFeB). The reference layer 68 may include a pinned layer, a fixed layer, or a combination thereof. The reference layer 68 may include at least one second magnetic layer including CoFeB. The storage layer 65 may face the reference layer 68. The tunnel barrier layer 67 may be interposed between the reference layer 68 and the storage layer 65.

The SOT line 85 may be disposed on a side surface of the MTJ 69. The SOT line 85 may be disposed adjacent to at least one side surface of the storage layer 65. The SOT line 85 may intersect the at least one side surface of the storage layer 65. The SOT line 85 may be in direct contact with the at least one side surface of the storage layer 65. The SOT line 85 may include a normal metal having a high spin-orbit coupling. The SOT line 85 may include, for example, platinum (Pt), tungsten (NV), tantalum (Ta), iridium (Ir), hafnium (Hf), hafnium/tungsten (Hf/W), titanium/cobalt iron boron (Ti/CoFeB), bismuth selenide (Bi2Se3), or a combination thereof. The SOT line 85 may include a material having a lower electrical resistance than the storage layer 65.

The MTJ 69 and the SOT line 85 may be arranged in various shapes. In some embodiments, the tunnel barrier layer 67 may be stacked on the storage layer 65. The reference layer 68 may be stacked on the tunnel barrier layer 67. Side surfaces of the storage layer 65, the tunnel barrier layer 67, and the reference layer 68 may be vertically aligned. The side surfaces of the storage layer 65, the tunnel barrier layer 67, and the reference layer 68 may be substantially coplanar.

Each of the reference layer 68 and the storage layer 65 may include a vertical magnetic layer. A magnetic polarization of the reference layer 68 may be fixed in a first vertical direction. The first vertical direction may correspond to a direction from the storage layer 65 toward the reference layer 68 or a direction from the reference layer 68 toward the storage layer 65. A magnetic polarization of the storage layer 65 may be switched to the first vertical direction or a second vertical direction opposite the first vertical direction due to a switching current flowing through the SOT line 85.

When the reference layer 68 and the storage layer 65 have a parallel magnetic polarization, the MTJ 69 may exhibit a low-resistance state. The low-resistance state may correspond to data "0." When the reference layer 68 and the storage layer 65 have an anti-parallel magnetic polarization, the MTJ 69 may exhibit a high-resistance state. The high-resistance state may correspond to data "1." The non-volatile memory device may be implemented using a spin-polarized current of the MTJ 69.

The SOT line 85 may be spaced apart from the reference layer 68 and the tunnel barrier layer 67. The SOT line 85 may be disposed at a different level than the reference layer 68 and the tunnel barrier layer 67. A top surface of the SOT line 85 may be disposed at a lower level than a top end of the storage layer 65. The top surface of the SOT line 85 may be disposed at a lower level than an interface between the storage layer 65 and the tunnel barrier layer 67.

A current flowing through the SOT line 85 may interact with the spin of a lattice due to a spin hall effect (SHE), such that spin polarization may occur in a direction perpendicular to a direction of current. The magnetic polarization of the storage layer 65 may be switched due to an SHE of the SOT line 85. When the current flows through the SOT line 85, which is disposed on a side surface of the storage layer 65 in the first lateral direction, the storage layer 65 may receive a spin torque in the first vertical direction due to the SHE, and the magnetic polarization of the storage layer 65 may be switched to the first vertical direction. The first lateral direction may intersect the first vertical direction. For example, the first lateral direction may be perpendicular to the first vertical direction. When the current flows through the SOT line 85 in a second lateral direction opposite the first lateral direction, the storage layer 65 may receive a spin torque in the second vertical direction opposite the first vertical direction due to the SHE. The magnetic polarization of the storage layer 65 may be switched to the second vertical direction opposite the first vertical direction.

Although semiconductor devices according to some embodiments of the inventive concept may not use spin tunneling torque (STT) switching, the semiconductor device may switch the magnetic polarization of the storage layer 65 using the SHE of the SOT line 85. Because a process margin for a thickness of the tunnel barrier layer 67 may be markedly increased, a semiconductor device having the MTJ 69 and the SOT line 85 may be advantageous for increasing a tunnel magnetoresistance (TMR), endurance, and integration density.

Figure 2:
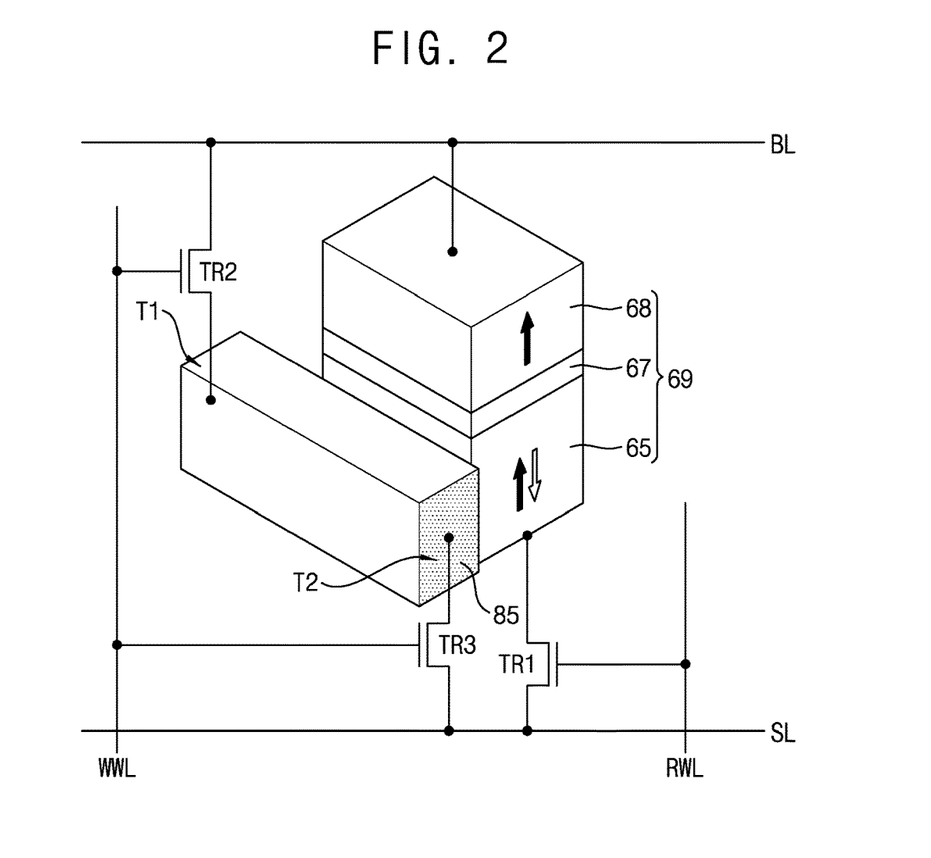
FIGS. 2 to 4 are schematic views illustrating a method of operating a semiconductor device according to some embodiments of the inventive concept.
Figure 3:
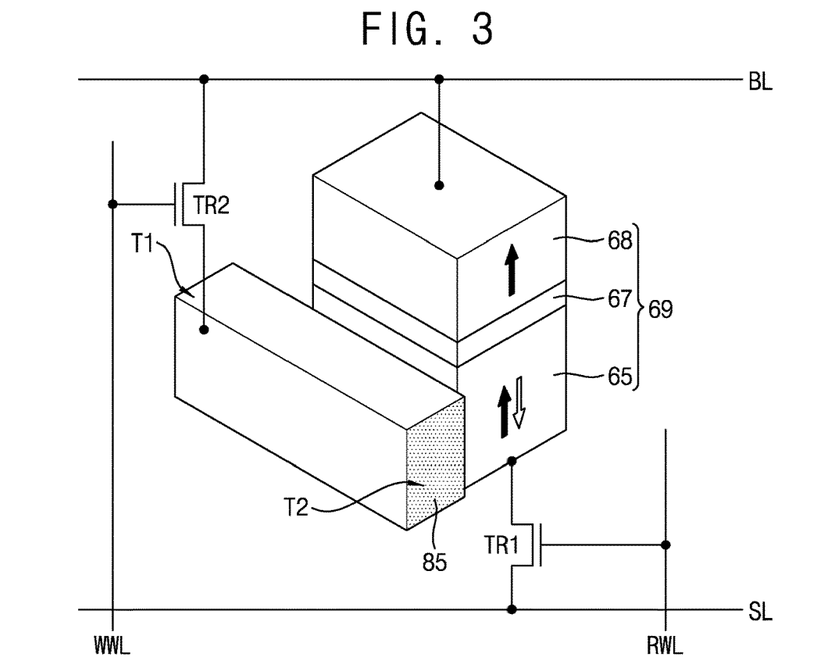
Figure 4:
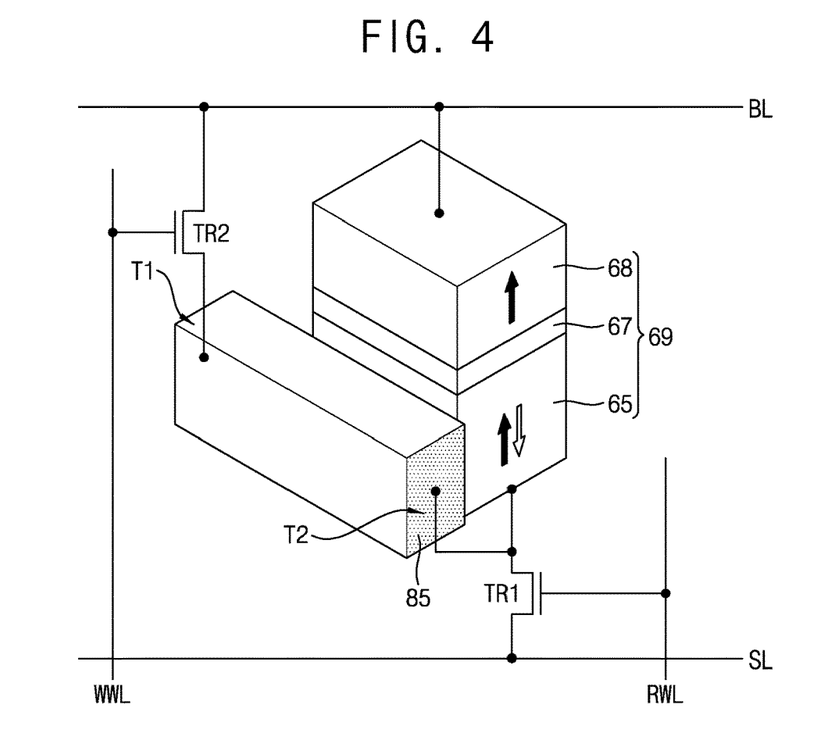

FIGS. 2 to 4 are schematic views illustrating operations of a semiconductor device according to some embodiments of the inventive concept. Referring to FIG. 2, a reference layer 68 may be connected to a bit line BL. A storage layer 65 may be connected to a source line SL through a first switching, element TR1. The SOT line 85 may include a first end T1 and a second end T2 facing the first end T1. The first end T1 and the second end T2 may be disposed at substantially the same level. At least a portion of a side surface of the SOT line 85 may be in contact with a portion of a side surface of the storage layer 65 between the first end T1 and the second end T2. The first end of the SOT line 85 may be connected to the bit line BL through a second switching element TR2. The second end T2 of the SOT line 85 may be connected to the source line SL through a third switching element TR3.

Each of the first switching element TR1, the second switching element TR2, and the third switching element TR3 may include a transistor. A gate electrode of the first switching element TR1 may be connected to a read word line RWL. The first switching element TR1 may be turned on or off by the read word line RWL. A gate electrode of the second switching element TR2 may be connected to a write word line WWL. A gate electrode of the third switching element TR3 may be connected to the write word line WWL. Each of the second switching element TR2 and the third switching element TR3 may be turned on or off by the write word line WWL.

TABLE 1

|  | WWL | RWL | BL | SL |
| --- | --- | --- | --- | --- |
| Write 0 | VDD | GND | VDD | GND |
| Write 1 | VDD | GND | GND | VDD |
| Read | GND | VDD | Vread | GND |

Referring to Table 1, in a write "0" operation, a drain voltage VDD may be applied to the write word line WWL, a ground GND may be connected to the read word line RWL, the drain voltage VDD may be applied to the bit line BL, and the source line SL may be connected to the ground GND. A current may flow between the first end T1 and the second end T2 in the first lateral direction, the storage layer 65 may receive a spin torque in the first vertical direction due to an SHE, and a magnetic polarization of the storage layer 65 may be switched to the first vertical direction.

In a write "1" operation, the drain voltage VDD may be applied to the write word line WWL, the read word line RWL may be connected to the ground GND, the bit line BL may be connected to the ground GND, and the drain voltage VDD may be applied to the source line SL. A current may flow between the first end T1 and the second end T2 in the second lateral direction opposite the first lateral direction, the storage layer 65 may receive a spin torque in the second direction opposite the first vertical direction due to an SHE, and a magnetic polarization of the storage layer 65 may be switched to the second vertical direction opposite the first vertical direction.

In a read operation, the write word line WWL may be connected to the ground GND, the drain voltage VDD may be applied to the read word line RWL, a read voltage Vread may be applied to the bit line BL, and the source line SL may be connected to the ground GND. The MTJ 69 may exhibit a low-resistance state or a high-resistance state depending on whether the magnetic polarization of the storage layer 65 has the first vertical direction or the second vertical direction. Data "0" or "1" may be read depending on the low-resistance state or the high-resistance state of the MTJ 69.

Referring to FIG. 3, the first end T1 of the SOT line 85 may be connected to the bit line BL through the second switching element TR2. A portion of the side surface of the SOT line 85 may be in contact with a portion of the side surface of the storage layer 65 between the first end T1 and the second end T2.

TABLE 2

|       | WWL | RWL | BL    | SL  |
|-------|-----|-----|-------|-----|
| Write 0 | VDD | VDD | VDD   | GND |
| Write 1 | VDD | VDD | GND   | VDD |
| Read    | GND | VDD | Vread | GND |

Referring to Table 2, in a write "0" operation, the drain voltage VDD may be applied to the write word line WWL, the drain voltage VDD may be applied to the read word line RWL, the drain voltage VDD may be applied to the bit line BL, and the source line SL may be connected to the ground GND. A current may flow between the first end T1 and the second end T2 in the first lateral direction, the storage layer 65 may receive a spin torque in the first vertical direction due to an SHE, and a magnetic polarization of the storage layer 65 may be switched to the first vertical direction.

In a write "1" operation, the drain voltage VDD may be applied to the write word line WWL, the drain voltage VDD may be applied to the read word line RWL, the bit line BL may be applied to the ground GND, and the drain voltage VDD may be applied to the source line SL. A current may flow between the first end T1 and the second end T2 in the second lateral direction opposite the first lateral direction and the storage layer 65 may receive a spin torque in the second vertical direction opposite the first vertical direction due to an SHE. A magnetic polarization of the storage layer 65 may be switched to the second vertical direction opposite the first vertical direction.

In a read operation, the write word line WWL may be connected to the ground GND, the drain voltage VDD may be applied to the read word line RWL, the read voltage Vread may be applied to the bit line BL, and the source line SL may be connected to the ground GND. Data "0" or "1" may be read depending on the low-resistance state or the high-resistance state of the MTJ 69.

Referring to FIG. 4, the second end T2 of the SOT line 85 may be connected between the storage layer 65 and the first switching element TR1. The second end T2 and the storage layer 65 may be connected to the source line SL through the first switching element TR1. An operation of writing data "0" or "1" to the MTJ 69 or an operation of reading data "0" or "1" may be performed using a similar method to that described with reference to FIG. 3 and Table 2.

FIGS. 5 to 8 are cross-sectional views illustrating a semiconductor device according to some embodiments of the inventive concept.

Figure 5:
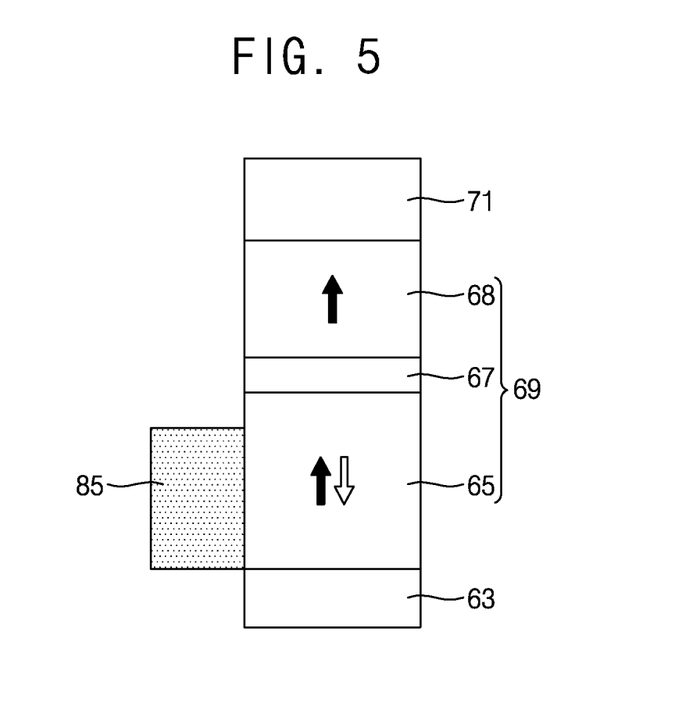
FIGS. 5 to 8 are cross-sectional views illustrating a semiconductor device according to some embodiments of the inventive concept.

Referring to FIG. 5, an MTJ 69 may be disposed on a buffer layer 63. A capping layer 71 may be disposed on the MTJ 69. The MTJ 69 may include a storage layer 65, a tunnel barrier layer 67, and a reference layer 68. An SOT line 85 may be disposed on a side surface of the storage layer 65. A bottom surface of the storage layer 65 may be in contact with a top surface of the buffer layer 63. A top surface of the reference layer 68 may be in contact with a bottom surface of the capping layer 71.

The SOT line 85 may be in direct contact with the side surface of the storage layer 65. The SOT line 85 may be spaced apart from the tunnel barrier layer 67 and the reference layer 68. A top surface of the SOT line 85 may be disposed at a lower level than a bottom surface of the tunnel barrier layer 67. An extension line of an interface between the SOT line 85 and the storage layer 65 may intersect an interface between the storage layer 65 and the tunnel barrier layer 67. The extension line of the interface between the SOT line 85 and the storage layer 65 may intersect the interface between the storage layer 65 and the tunnel barrier layer 67.

The SOT line 85 may be spaced apart from the buffer layer 63. A bottom surface of the SOT line 85 may be disposed at a higher level than the top surface of the buffer layer 63.

Figure 6:
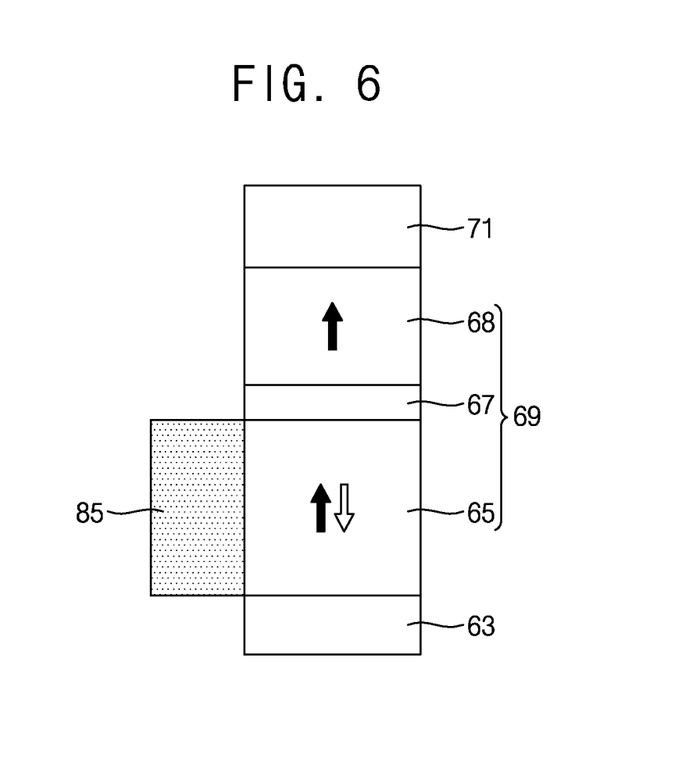

Referring to FIG. 6, the top surface of the SOT line 85 may be disposed at the same level as a top surface of the storage layer 65. The interface between the SOT line 85 and the storage layer 65 may intersect the interface between the storage layer 65 and the tunnel barrier layer 67. The extension line of the interface between the SOT line 85 and the storage layer 65 may intersect the interface between the storage layer 65 and the tunnel barrier layer 67.

Figure 7:
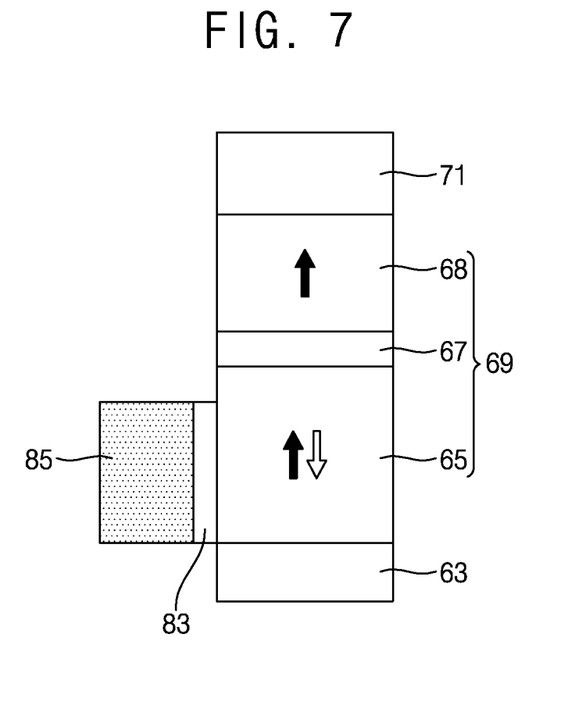

Referring to FIG. 7, a spacer 83 may be interposed between the SOT line 85 and the storage layer 65. The spacer 83 may include a different material from the SOT line 85 and the storage layer 65. The spacer 83 may include, for example, an insulating layer including silicon oxide, silicon nitride, silicon oxynitride, or a combination thereof.

Figure 8:
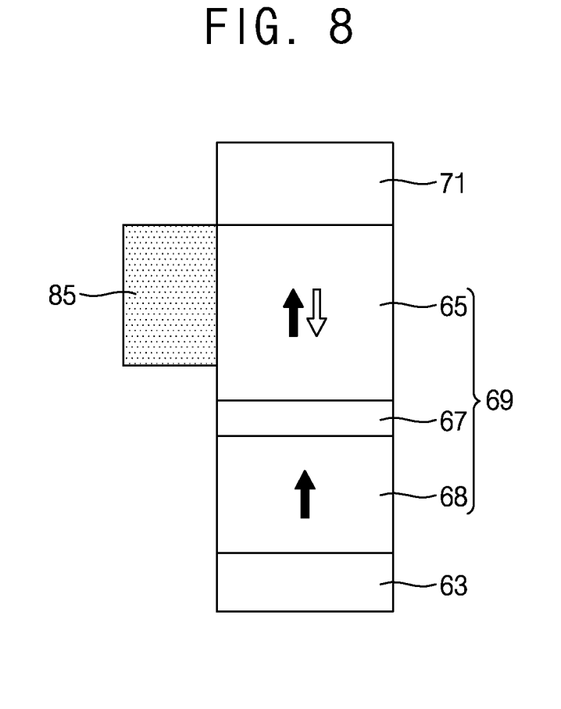

Referring to FIG. 8, the MTJ 69 may include a reference layer 68, a tunnel barrier layer 67, and a storage layer 65, which are sequentially stacked. A bottom surface of the reference layer 68 may be in contact with the top surface of the buffer layer 63. The top surface of the storage layer 65 may be in contact with the bottom surface of the capping layer 71. The SOT line 85 may be disposed on the side surface of the storage layer 65. The bottom surface of the storage layer 65 may be disposed at a higher level than a top surface of the tunnel barrier layer 67.

FIGS. 9 to 13 are layouts illustrating components of a semiconductor device according to some embodiments of the inventive concept.

Figure 9:
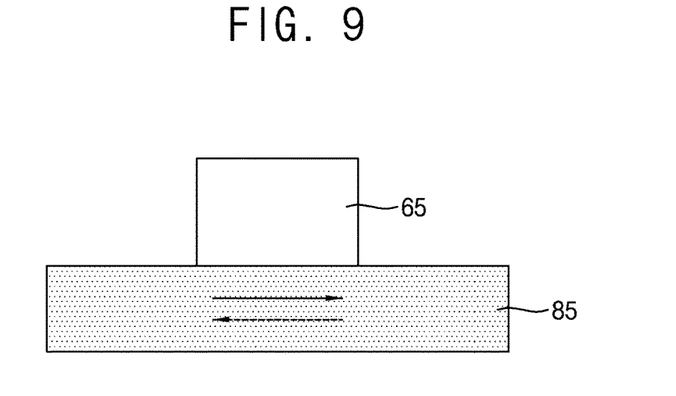
FIGS. 9 to 13 are layouts illustrating main components of a semiconductor device according to some embodiments of the inventive concept.

Referring to FIG. 9, an SOT line 85 may be disposed adjacent to a side surface of a storage layer 65. The SOT line 85 may be in direct contact with the side surface of the storage layer 65. The SOT line 85 may intersect the side surface of the storage layer 65. The SOT line 85 may have a greater lateral width than the storage layer 65.

Figure 10:
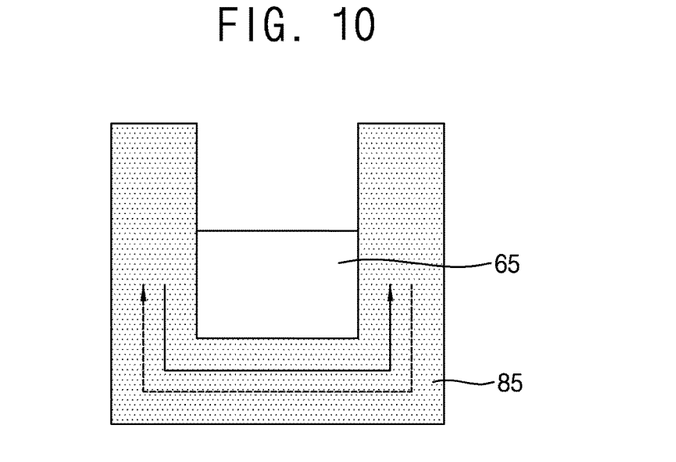

Referring to FIG. 10, the storage layer 65 may have four side surfaces. The SOT line 85 may be disposed on three of the four side surfaces of the storage layer 65, partially surrounding the storage layer 65.

Figure 11:
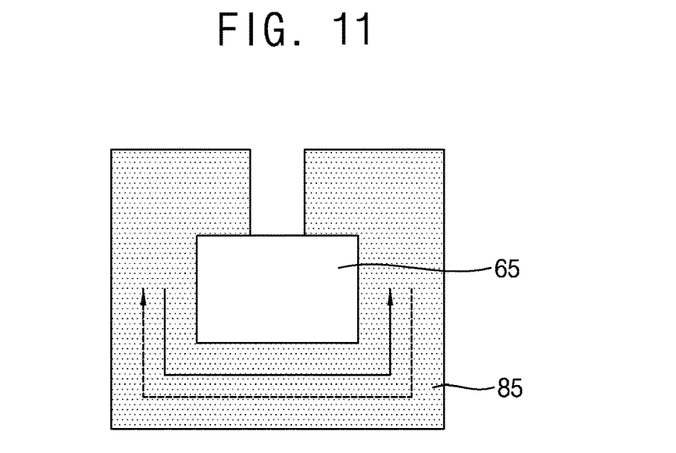

Referring to FIG. 11, the SOT line 85 may be disposed on three of the four side surfaces of the storage layer 65 and partially extend on a fourth side surface of the storage layer 65.

Figure 12:
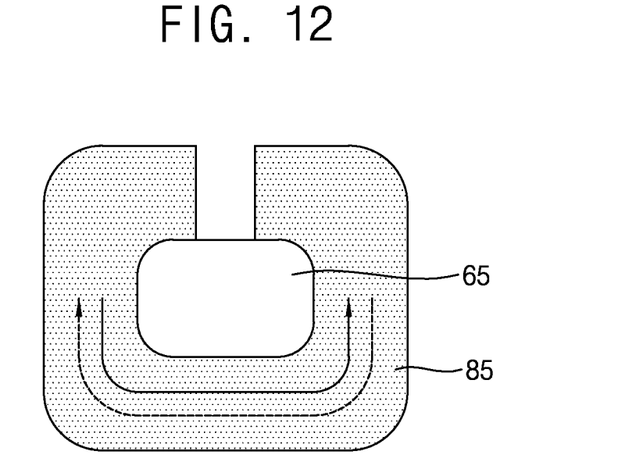

Referring to FIG. 12, the storage layer 65 may have a rounded cross-section. The SOT line 85 may partially surround the storage layer 65. Ends of the SOT line 85 may be spaced apart.

Figure 13:
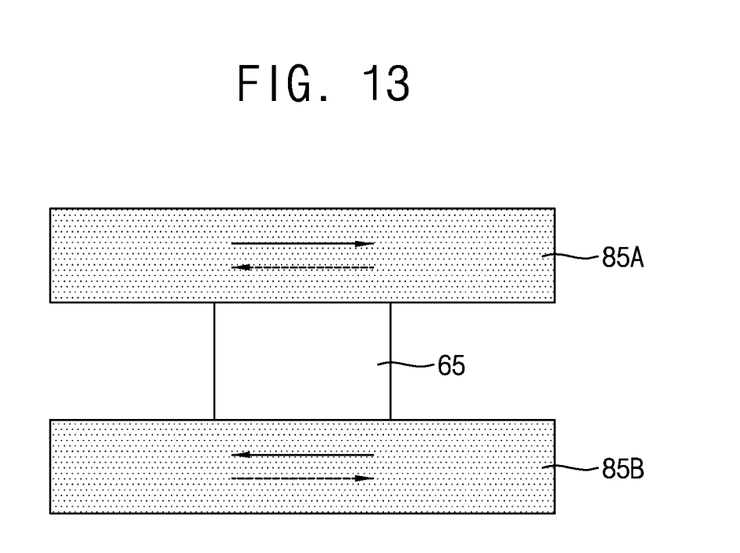

Referring to FIG. 13, the storage layer 65 may be disposed between a first SOT line 85A and a second SOT line 85B, which may face each other. The first SOT line 85A and the second SOT line 85B may be spaced apart. A first lateral current may be applied to the first SOT line 85A, while a second lateral current may be applied to the second SOT line 85B. The first lateral current and the second lateral current may flow in opposite directions.

FIGS. 14 to 17 are cross-sectional views illustrating operations for forming a semiconductor device according to some embodiments of the inventive concept.

Figure 14:
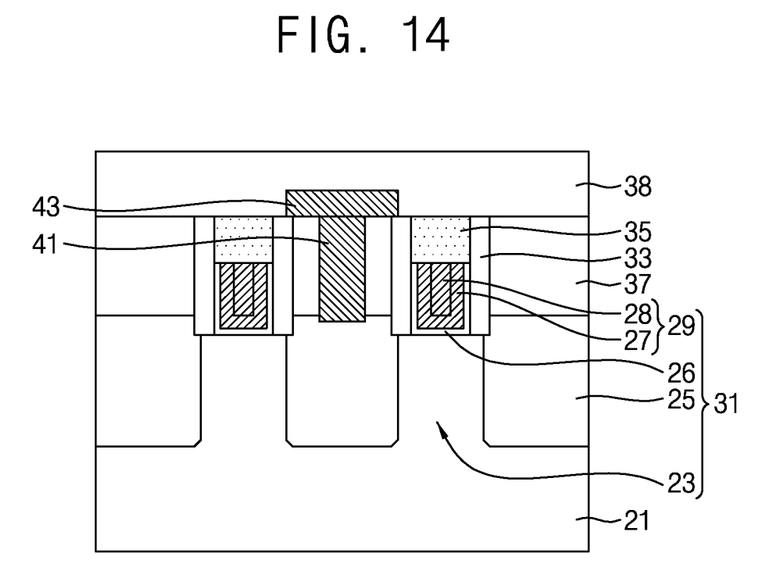
FIGS. 14 to 17 are cross-sectional views illustrating a method of forming a semiconductor device according to some embodiments of the inventive concept.

Referring to FIG. 14, a switching element 31, a lower insulating layer 37, an interlayer insulating layer 38, a source plug 41, and a source line 43 may be formed on a substrate 21. The switching element 31 may include an active region 23, source and drain regions 25, a gate dielectric layer 26, and a gate electrode 29. The gate electrode 29 may include a work-function conductive layer 27 and a gate conductive layer 28. Gate spacers 33 may be formed on side surfaces of the gate electrode 29. A gate capping pattern 35 may be formed on the gate electrode 29.

In some embodiments, the active region 23 may include a fin active region and the switching element 31 may correspond to a fin field effect transistor (finFET). In some embodiments, the switching element 31 may include a planar transistor, a recess channel array transistor (RCAT), a vertical transistor, a nanowire transistor, a multi-bridge channel (MBC) transistor, a three-dimensional (3D) transistor, a diode, or a combination thereof.

The substrate 21 may include a semiconductor substrate such as a silicon wafer or a silicon on insulator (SOI) wafer. The active region 23 may be defined within one surface of the substrate 21. In some embodiments, the active region 23 may include a single crystalline silicon layer containing P-type impurities. The source and drain regions 25 may be formed adjacent to respective sides of the gate electrode 29. The source and drain regions 25 may have a different conductivity type from that of the active region 23. For example, the source and drain regions 25 may include a semiconductor layer containing N-type impurities, which may be formed using a selective epitaxial growth (SEG) method. Top ends of the source and drain regions 25 may protrude to a level higher than a bottom surface of the gate electrode 29.

The gate electrode 29 may correspond to a word line. The gate electrode 29 may include a metal, a metal nitride, a metal silicide, conductive carbon, polysilicon, or a combination thereof. In some embodiments, the gate electrode 29 may correspond to a replacement gate. The gate electrode 29 may cover a top surface and side surfaces of the active region 23. The gate dielectric layer 26 may be interposed between the gate electrode 29 and the active region 23. The gate dielectric layer 26 may cover a bottom surface and side surfaces of the gate electrode 29. The gate dielectric layer 26 may include silicon oxide, silicon nitride, silicon oxynitride, a high-k dielectric, or a combination thereof.

The gate spacers 33 may cover the side surfaces of the gate electrode 29 and side surfaces of the gate capping pattern 35. The gate spacers 33 may include silicon oxide, silicon nitride, silicon oxynitride, a low-k dielectric, or a combination thereof. The gate capping pattern 35 may be disposed on and aligned with the gate electrode 29. The gate capping pattern 35 may include silicon oxide, silicon nitride, silicon oxynitride, a low-k dielectric, or a combination thereof. In some embodiments, the gate spacers 33 and the gate capping pattern 35 may include silicon nitride.

The lower insulating layer 37 may cover the source and drain regions 25. Top surfaces of the lower insulating layer 37, the gate capping pattern 35, and the gate spacer 33 may be substantially coplanar. The interlayer insulating layer 38 may cover the lower insulating layer 37, the gate capping pattern 35, and the gate spacer 33. The lower insulating layer 37 and the interlayer insulating layer 38 may include silicon oxide, silicon nitride, silicon oxynitride, a low-k dielectric, or a combination thereof.

The source plug 41 may pass through the lower insulating layer 37 and be connected to a corresponding one of the source and drain regions 25. The source line 43 may be disposed in the interlayer insulating layer 38 and connected to the source plug 41. The source plug 41 and the source line 43 may include a metal, a metal nitride, a metal silicide, conductive carbon, polysilicon, or a combination thereof.

Figure 15:
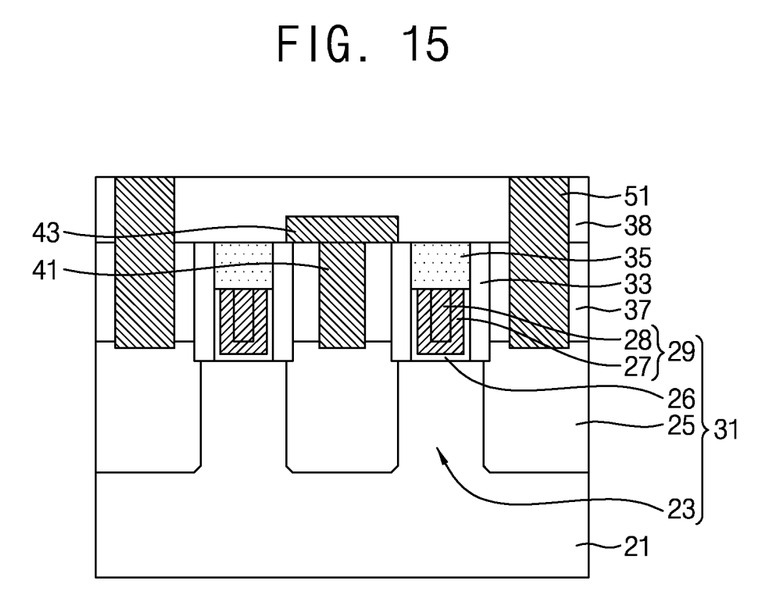

Referring to FIG. 15, a lower plug 51 may be formed to pass through the interlayer insulating layer 38 and the lower insulating layer 37 and connected to a corresponding one of the source and drain regions 25. The lower plug 51 may include a metal, a metal nitride, a metal silicide, conductive carbon, polysilicon, or a combination thereof. Top surfaces of the interlayer insulating layer 38 and the lower plug 51 may be exposed and be substantially coplanar.

Figure 16:
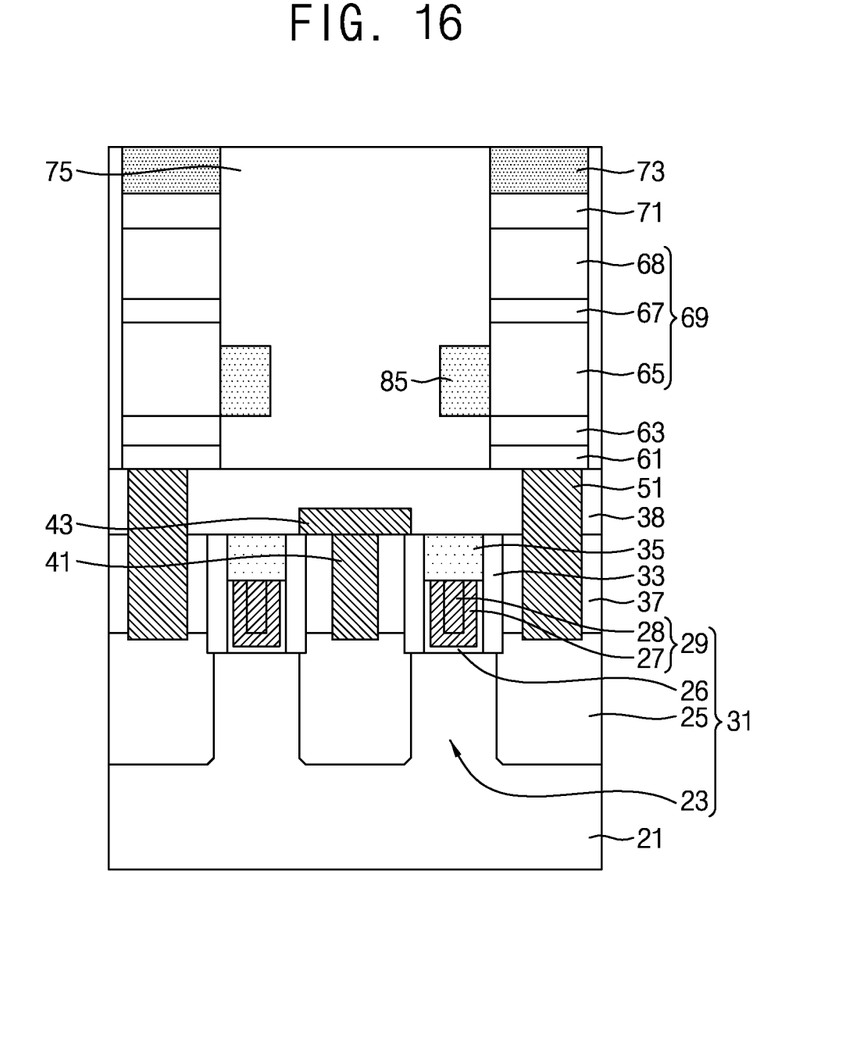

Referring to FIG. 16, an upper insulating layer 75 may be formed on the interlayer insulating layer 38 and the lower plug 51. A first electrode 61, a buffer layer 63, an MTJ 69, a capping layer 71, a second electrode 73, and an SOT line 85 may be formed in the upper insulating layer 75.

The first electrode 61 may be in direct contact with the lower plug 51. The first electrode 61 may include titanium (Ti), titanium nitride (TiN), tantalum (Ta), tantalum nitride (TaN), tungsten (W), tungsten nitride (WN), or a combination thereof. For example, the first electrode 61 may include a TiN layer. The buffer layer 63 may be formed on the first electrode 61. The buffer layer 63 may include a multilayered structure. The buffer layer 63 may include a seed layer. At least a portion of the buffer layer 63 may serve to match a crystalline structure among a plurality of layers. The buffer layer 63 may include tantalum (Ta), ruthenium (Ru), platinum (Pt), palladium (Pd), or a combination thereof.

The MTJ 69 may include a storage layer 65, a tunnel barrier layer 67, and a reference layer 68, which are sequentially stacked. The storage layer 65 may include at least one first magnetic layer including CoFeB. The storage layer 65 may include a free layer. The storage layer 65 may include at least one synthetic antiferromagnetic (SAF) structure. The SAF structure may include two magnetic layers and a spacer layer interposed between the two magnetic layers. For example, the SAF structure may include a cobalt iron boron (CoFeB) layer, a ruthenium (Ru) layer, and a cobalt iron (CoFe) layer, which are sequentially stacked.

The tunnel barrier layer 67 may be formed between the storage layer 65 and the reference layer 68. The tunnel barrier layer 67 may include a metal oxide, such as magnesium oxide (MgO), ruthenium oxide (RuO), vanadium oxide (VO), tungsten oxide (WO), tantalum oxide (TaO), hafnium oxide (HfO), molybdenum oxide (MoO), or a combination thereof. For example, the tunnel barrier layer 67 may be an MgO layer. The reference layer 68 may include at least one second magnetic layer including CoFeB. The reference layer 68 may include a pinned layer, a fixed layer, or a combination thereof. In some embodiments, the reference layer 68 may include at least one SAF structure. The SAF structure may include two magnetic layers and a spacer layer interposed between the two magnetic layers.

The capping layer 71 may include a metal oxide, such as RuO, MgO, VO, WO, TaO, HfO, MoO, or a combination thereof. For example, the capping layer 71 may include a RuO layer. The second electrode 73 may correspond to an upper electrode. The second electrode 73 may include Ti, TiN, Ta, TaN, W, WN, or a combination thereof. For example, the second electrode 73 may include a TiN layer.

The SOT line 85 may be formed adjacent to a side surface of the storage layer 65 in the upper insulating layer 75. Configurations of the SOT line 85 and the storage layer 65 may have various shapes which are similar to those described with reference to FIGS. 1 to 13. Top surfaces of the upper insulating layer 75 and the second electrode 73 may be substantially coplanar. The upper insulating layer 75 may include silicon oxide, silicon nitride, silicon oxynitride, a low-k dielectric, or a combination thereof.

Figure 17:
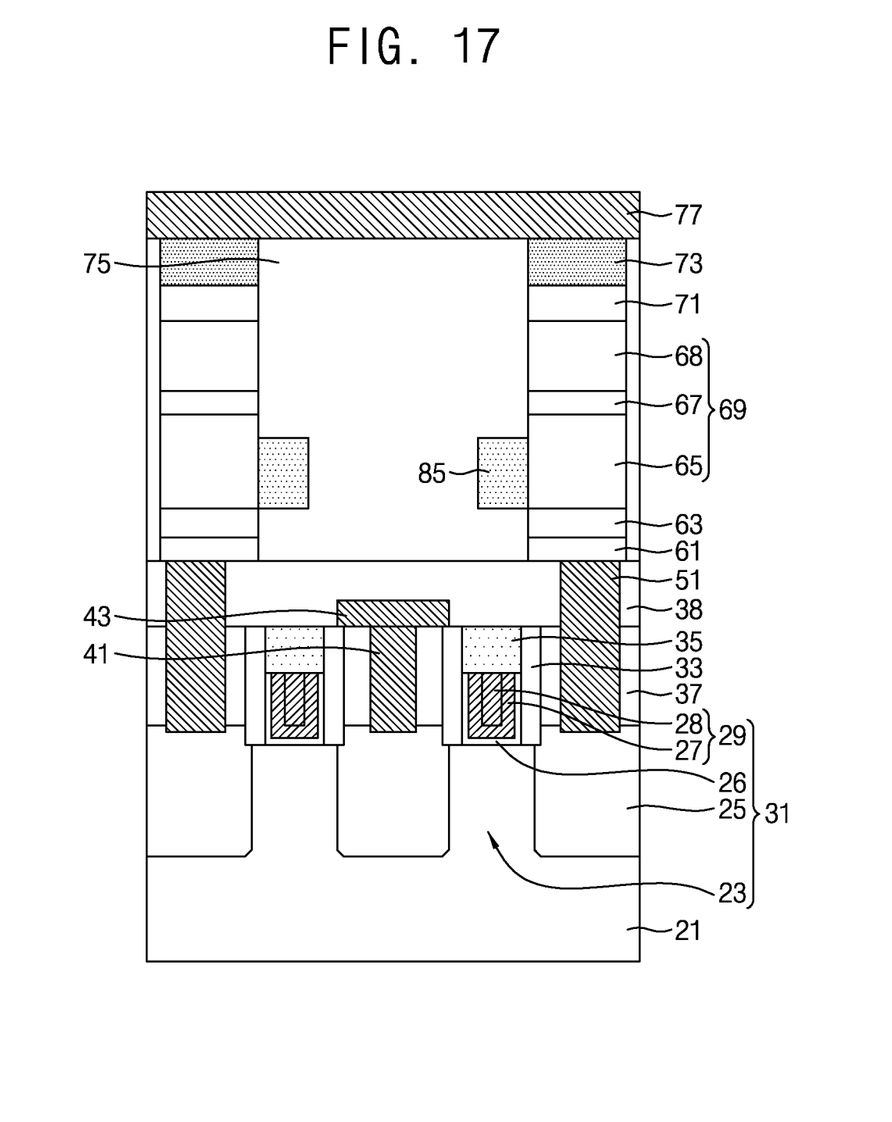

Referring to FIG. 17, an upper interconnection 77 may be formed on the upper insulating layer 75 and the second electrode 73. The upper interconnection 77 may be formed on the upper insulating layer 75 and the second electrode 73. The upper interconnection 77 may include, for example, a metal, a metal nitride, a metal silicide, conductive carbon, or a combination thereof. The upper interconnection 77 may be in contact with the second electrode 73. The upper interconnection 77 may correspond to a bit line.

According to some example embodiments of the inventive concept, an SOT line disposed on a side surface of a storage layer can be provided. A magnetic polarization of the storage layer can be switched using an SHE of the spin-orbit torque line. A semiconductor device that is advantageous for an increase in integration density and has excellent electrical characteristics can be implemented.

While embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A semiconductor device comprising:
   a magnetic tunnel junction comprising:
      a storage layer comprising at least one first magnetic layer;
      a reference layer comprising a bottom surface facing a top surface of the storage layer, and the reference layer comprising at least one second magnetic layer; and
      a tunnel barrier layer between the top surface of the storage layer and the bottom surface of the reference layer; and
   a spin-orbit torque line adjacent to a side surface of the storage layer.

2. The semiconductor device of claim 1, wherein the spin-orbit torque line directly contacts the side surface of the storage layer.

3. The semiconductor device of claim 1, wherein a length of the spin-orbit torque line is longer than a length of the side surface of the storage layer.

4. The semiconductor device of claim 1, wherein the spin-orbit torque line is spaced apart from the reference layer.

5. The semiconductor device of claim 1, wherein a height of the spin-orbit torque line is shorter than a height of the storage layer.

6. The semiconductor device of claim 1, wherein the spin-orbit torque line comprises:
   a first spin-orbit torque line; and
   a second spin-orbit torque line facing the first spin-orbit torque line,
   wherein the storage layer is disposed between the first spin-orbit torque line and the second spin-orbit torque line.

7. The semiconductor device of claim 1, wherein the spin-orbit torque line comprises a normal metal.

8. The semiconductor device of claim 1, wherein the spin-orbit torque line comprises at least one of platinum, tungsten, tantalum, iridium, hafnium, hafnium/tungsten, titanium/cobalt iron boron, and bismuth selenide.

9. The semiconductor device of claim 1, further comprising a spacer disposed between the spin-orbit torque line and the storage layer, the spacer comprising a material different than a material of the spin-orbit torque line and a material of the storage layer.

10. The semiconductor device of claim 1, wherein a magnetic polarization of the storage layer exhibits a vertical direction, wherein a current flowing through the spin-orbit torque line flows in a lateral direction intersecting the vertical direction.

11. The semiconductor device of claim 10, wherein the lateral direction is perpendicular to the vertical direction.

12. The semiconductor device of claim 1, further comprising:
   a source line;
   a first transistor connected between the source line and the storage layer;
   a read word line connected to a gate electrode of the first transistor;
   a bit line connected to the reference layer;
   a second transistor connected between a first end of the spin-orbit torque line and the bit line; and
   a write word line connected to a gate electrode of the second transistor.

13. The semiconductor device of claim 12, wherein a first binary value is written to the semiconductor device by:
   applying a drain voltage to the write word line;
   connecting the read word line to ground;
   applying the drain voltage to the bit line; and
   connecting the source line to ground.

14. The semiconductor device of claim 13, wherein a second binary value is written to the semiconductor device by:
   applying a drain voltage to the write word line;
   connecting the read word line to ground;
   connecting the bit line to ground; and
   applying the drain voltage to the source line.

15. The semiconductor device of claim 14, wherein the first binary value or the second binary value written to the semiconductor device is read from the semiconductor device by:
   connecting the write word line to ground;
   applying a drain voltage to the read word line;
   applying a read voltage to the bit line; and
   connecting the source line to ground.

16. The semiconductor device of claim 12, further comprising a third transistor connected between a second end of the spin-orbit torque line, and the source line, wherein a gate electrode of the third transistor is connected to the write word line.

17. The semiconductor device of claim 16, wherein a first binary value is written to the semiconductor device by:
   applying a drain voltage to the write word line;
   connecting the read word line to ground;
   applying the drain voltage to the bit line; and
   connecting the source line to ground.

18. The semiconductor device of claim 17, wherein a second binary value is written to the semiconductor device by:
   applying a drain voltage to the write word line;
   connecting the read word line to ground;
   connecting the bit line to ground; and
   applying the drain voltage to the source line.

19. The semiconductor device of claim 18, wherein the first binary value or the second binary value written to the semiconductor device is read from the semiconductor device by:
- connecting the write word line to ground;
- applying a drain voltage to the read word line;
- applying a read voltage to the bit line; and
- connecting the source line to ground.

20. A semiconductor device comprising:
- a switching element on a substrate;
- a first electrode on the substrate and electrically connected to the switching element;
- a buffer layer on the first electrode;
- a magnetic tunnel junction on the buffer layer and comprising a storage layer, a reference layer facing the storage layer, and a tunnel barrier layer between the storage layer and the reference layer;
- a capping layer on the magnetic tunnel junction;
- a second electrode on the capping layer; and
- at least one spin-orbit torque line adjacent a side of the storage layer.

* * * * *